United States Patent [19]

Cabler

[11] Patent Number: 5,442,309
[45] Date of Patent: Aug. 15, 1995

[54] LOW DISTORTION OUTPUT STAGE

[75] Inventor: Carlin D. Cabler, Austin, Tex.

[73] Assignee: Advanced Micro Devices, Inc., Sunnyvale, Calif.

[21] Appl. No.: 168,103

[22] Filed: Dec. 14, 1993

[51] Int. Cl.⁶ .............................................. H03K 3/00
[52] U.S. Cl. ...................................... 327/108; 327/72; 327/544; 327/563; 330/257; 330/260
[58] Field of Search ................... 327/72, 73, 77, 108, 327/378, 379, 384, 389, 540, 541, 544, 563; 330/257, 288, 260, 255

[56] References Cited

U.S. PATENT DOCUMENTS

| | | | |
|---|---|---|---|
| 4,661,779 | 4/1987 | Okamoto | 330/257 |
| 4,881,045 | 11/1989 | Dillman | 330/257 |
| 4,926,068 | 5/1990 | Fujita | 307/359 |
| 5,097,223 | 3/1992 | Alexander | 330/260 |
| 5,212,458 | 5/1993 | Fitzpatrick et al. | 330/257 |
| 5,349,305 | 9/1994 | Hsiao et al. | 330/257 |

FOREIGN PATENT DOCUMENTS

0479119A2  4/1992  European Pat. Off.

OTHER PUBLICATIONS

"A 50-MHz CMOS Variable Gain Amplifier for Magnetic Data Storage Systems," R. Gomez and A. A. Abidi, *IEEE Journal of Solid-State Circuits* (1992) Jun., No. 6, New York, pp. 935–939.

"Design and Applications of Tunable Analog BiCMOS Circuits," J. Fichtel, et al., *IEEE Journal of Solid-State Circuits*, (1992) Jul., No. 7, New York, pp. 1101–1104.

*Primary Examiner*—Timothy P. Callahan
*Assistant Examiner*—My-Trang Nu Ton
*Attorney, Agent, or Firm*—Fulbright & Jaworski

[57] ABSTRACT

A low distortion, low power output stage comprises a differential amplifier which replaces the source follower and constant current sources found in conventional output stages. Because there is no voltage drop between the inverting and noninverting differential inputs of the amplifier, no voltage drop exists between the input and output of the output stage. Thus, the gain stage or stages which precede the output stage are not required to swing above the output swing of the output stage. Additionally, because the amplifier has a common mode range which allows it to swing nearly rail-to-rail, the output of the output stage also swings nearly rail-to-rail.

5 Claims, 9 Drawing Sheets

LOW DISTORTION OUTPUT STAGE

BACKGROUND OF THE INVENTION

1. Field of the Invention

The present invention relates to an output stage for driving a load and, more particularly, but not by way of limitation, to a low distortion output stage for driving a low impedance load.

2. Description of the Related Art

Audio chips presently enable personal computers, compact disk players, and other portable audio devices to execute high quality, low power audio applications. Audio chips usually comprise digital circuitry which occupies approximately 75–80% of the audio chip's silicon space and analog circuitry which occupies the remaining 20–25%. Typically, the analog circuitry comprises an analog-to-digital converter, digital-to-analog converter and some output amplifiers. The analog circuitry converts an analog audio input signal into a digital format suitable for the digital circuitry to process. Also, the analog circuitry converts the digital signals back into an analog format suitable to drive a low impedance load, such as a speaker. The digital circuitry occupies the majority of the silicon area and typically performs digital signal processing, such as filtering, noise shaping, and synthesizing, on the converted analog signals. The main function of these audio chips is to implement an entire audio system on one piece of silicon.

The conventional analog circuitry utilized to implement high quality audio chips comprises a differential operational amplifier (op-amp) having at least one gain stage cascaded to an output stage. Because the present trend in analog circuitry design utilizes smaller power supplies, the differential op-amp should be capable of operating from a smaller power supply, yet continue to provide the output range performance found in higher voltage applications. To satisfy this requirement, the output stage of the differential op-amp must have very low distortion so that it is capable of swinging nearly rail-to-rail to drive the low impedance load.

FIG. 1 illustrates output stage 200 of U.S. Pat. No. 5,198,782, entitled "Low Distortion Amplifier Output Stage for DAC", issued Mar. 30, 1993 to Jeffrey W. Scott. Referring to FIG. 1, output stage 200 comprises source follower transistor 266, sourcing transistor 284, sinking transistor 286, feedback transistors 290, 288, and 292, and constant current source transistors 280 and 282.

Specifically, transistor 266 is configured as a unity gain source follower and comprises: 1) a gate for receiving an analog input signal ($V_{IN}$); 2) a source connected to the output of output stage 200 (i.e., node 260); and 3) a drain connected to node 268. The voltage at node 260 follows $V_{IN}$ minus the gate-to-source voltage drop ($V_{GS}$) across transistor 266. In other words, the output of output stage 200 follows the analog input signal $V_{IN}$ minus $V_{GS}$.

P-channel transistor 280 includes a source which is connected to a DC power supply $V_{DDA}$ and a drain which is connected to node 268. A biasing circuit (not shown) biases the gate of transistor 280 such that transistor 280 remains in its saturation mode. Consequently, transistor 280 functions as a constant current source to provide a constant drain current to transistor 266. N-channel transistor 282 includes a source which is connected to ground $V_{SSA}$ and a drain which is connected to node 260. A biasing circuit biases the gate of transistor 282 such that transistor 282 remains in its saturation mode to sink a constant current between the source of transistor 266 (i.e., node 260) and ground $V_{SSA}$. Accordingly, because the current through transistors 280 and 282 remains constant, the current through transistor 266 remains constant to ensure that changes in $V_{IN}$ will be reflected at output node 260 and, thus, load 264.

Sourcing and sinking transistors 284 and 286 source and sink current, respectively, to maintain the appropriate voltage (i.e., $V_{IN}$ minus $V_{GS}$) at node 260. Specifically, during negative swings of $V_{IN}$, sinking transistor 286 sinks more current to drop the voltage at node 260. Conversely, during positive swings of $V_{IN}$, sourcing transistor 284 sources more current to increase the voltage at node 260.

Unfortunately, as previously described, the voltage at node 260 cannot entirely follow (i.e., equal) $V_{IN}$ because of the gate-to-source voltage drop ($V_{GS}$) across transistor 266. In fact, the output voltage at node 260 may be, illustratively, between 0.7 to 1.5 volts less than $V_{IN}$. Therefore, output stage 200 cannot drive node 260 and, thus, load 264 near the upper rail voltage (i.e., $V_{DDA}$). This voltage drop $V_{GS}$ is particularly significant and disadvantageous when small DC power supplies are employed. Illustratively, if $V_{IN} = 2.7$ volts, the output voltage at node 260 could be as low as 1.2 volts (i.e., $2.7 - 1.5 = 1.2$). To compensate for the $V_{GS}$ drop across transistor 266, the gain stage or stages which precede output stage 200 must be capable of swinging a full $V_{GS}$ higher than output stage 200, placing significant design constraints on these gain stages. Therefore, output stage 200 is undesirable for use in low voltage and/or high signal swing applications because its output swing cannot approach the rail voltages.

Accordingly, a market demands exists for a low distortion output stage which is capable of swinging nearly rail-to-rail. This output stage would be particularly well suited for low voltage applications that require the output stage to operate from a low supply voltage, yet provide the output range performance of higher voltage applications.

SUMMARY

In accordance with the present invention, a new and improved output stage comprises a differential amplifier which replaces the source follower and constant current sources found in conventional output stages. Because there is no voltage drop between the inverting and noninverting differential inputs of the amplifier, no voltage drop exists between the input and output of the output stage. Thus, the gain stage or stages which precede the output stage do not have to swing above the output swing of the output stage. Additionally, because the amplifier has a common mode range which allows it to swing nearly rail-to-rail, the output of the output stage also swings nearly rail-to-rail.

It is therefore an object of the present invention to provide an output stage having low distortion.

It is another object of the present invention to provide an output stage which is capable of swinging nearly rail-to-rail.

It is a further object of the present invention to provide an output stage which has no voltage drop between its input and output.

These and other objects, features, and advantages of the present invention will become evident to those skilled in the art in light of the following drawings and detailed description of the preferred embodiment.

DETAILED DESCRIPTION OF THE PREFERRED EMBODIMENTS

Figure 1:
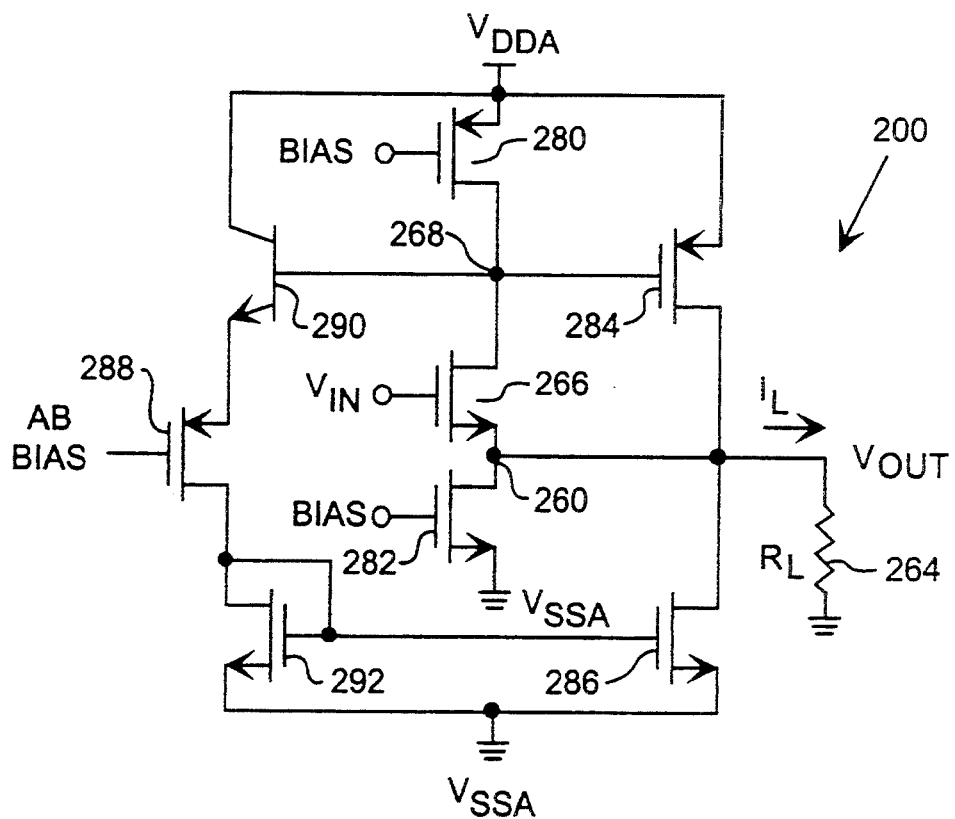
FIG. 1 is a schematic diagram of a conventional, prior art output stage.
Figure 2:
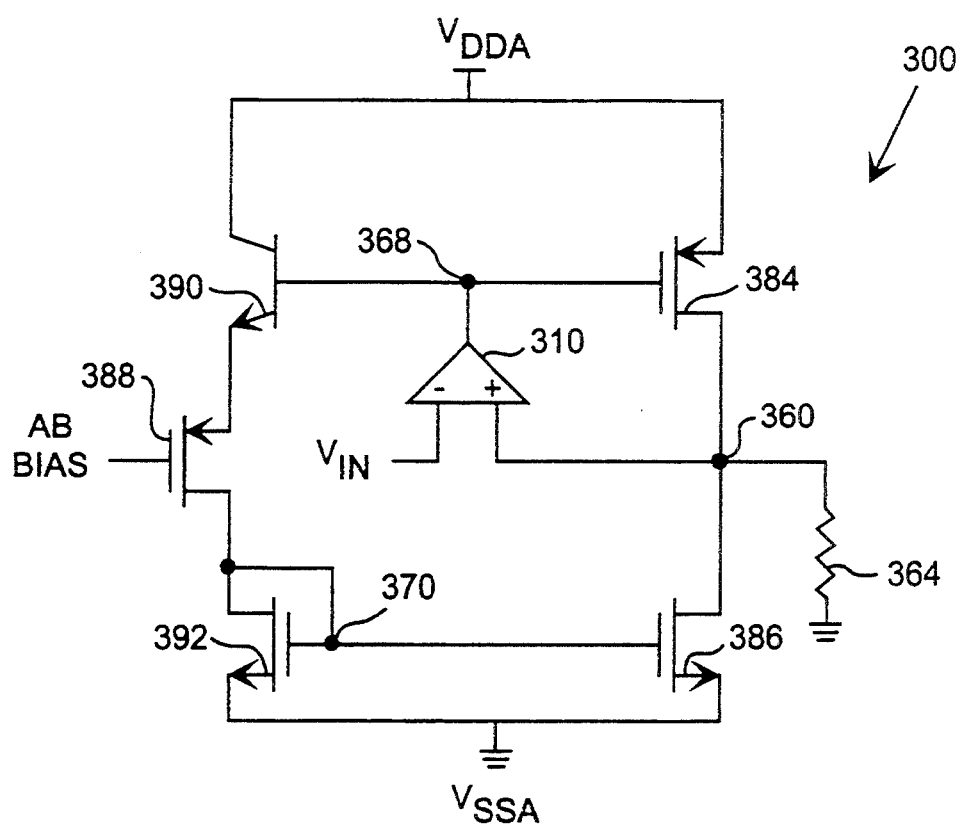
FIG. 2 is a schematic diagram of the preferred embodiment of the output stage of the present invention.

Referring to FIG. 2, output stage 300 comprises: 1) an inverting differential amplifier 310; 2) P-channel sourcing transistor 384 and N-channel sinking transistor 386; and 3) a feedback network comprising N-channel transistor 392, P-channel transistor 388, and an NPN bipolar junction transistor 390 which is configured as an emitter follower. All P-channel and N-channel transistors in all embodiments of the present invention are enhancement-type, metal-oxide silicon field effect transistors (i.e., MOSFETs). DC power is supplied by power supply $V_{DDA}$ and reference potential $V_{SSA}$ (e.g. ground).

Figure 3:
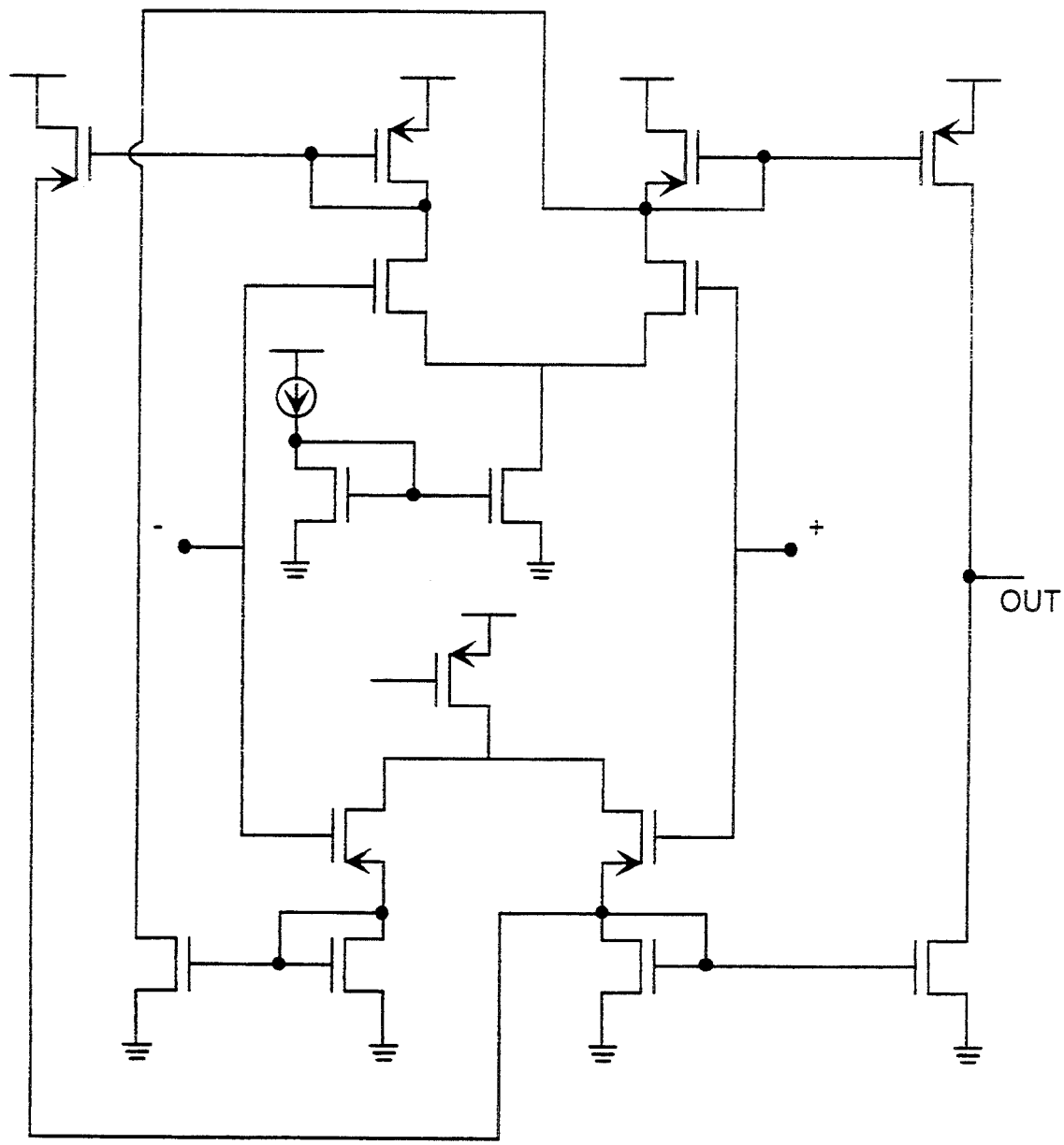
FIG. 3 is a schematic diagram of an amplifier capable of swinging nearly rail-to-rail suitable for use in the output stage of FIGS. 2, 4, and 5.

Amplifier 310 includes an inverting input or receiving an analog input signal $V_{IN}$, such as an audio signal, a noninverting input connected to the output of output stage 300 (i.e., node 60), and an output connected to node 368. Any suitable differential amplifier may implement amplifier 310, however, in this preferred embodiment, amplifier 310 should have a common mode range which allows it to swing nearly rail-to-rail. That is, amplifier 310 should be capable of swinging nearly rail-to-rail when a common signal is applied to both its inverting and noninverting input. FIG. 3 illustrates an amplifier suitable to implement amplifier 310, the operation of which is disclosed in *IEEE Journal of Solid-State Circuits*, Vol. 1 SC-22, No. 6, December 1957, pp. 1204–1207.

Again referring to FIG. 2, the feedback network (i.e., transistors 390, 388, 392, and 386, and amplifier 310) and sourcing and sinking transistors 384 and 386, respectively, cause the voltage at node 360 to follow the analog input signal $V_{IN}$ applied at the inverting terminal of amplifier 310. Specifically, as $V_{IN}$ swings positive with respect to the voltage on node 360, inverting amplifier 310 swings the voltage at node 368 comparably negative. Thus, the magnitude of the gate-to-source voltage on transistor 388 decreases. Consequently, the drain-source current through transistor 388 of the feedback network decreases. As a result, the drain-source current through sinking transistor 386 decreases through the action of the current mirror arrangement formed by transistors 392 and 386.

Moreover, as the voltage on node 368 swings negative with respect to the voltage on node 360 (e.g., the voltage on node 368 is within a first range which is more negative with respect to node 360), the magnitude of the gate-source voltage of sourcing transistor 384 increases. Consequently, sourcing transistor 384 sources more current to drive load 364 and increase the voltage on node 360 until it matches $V_{IN}$.

Conversely, as $V_{IN}$ swings negative with respect to the voltage on node 360, inverting amplifier 310 swings the voltage on node 368 comparably positive. As the voltage on node 368 swings positive with respect to the voltage on node 360 (e.g., the voltage on node 368 is within a second range which is more positive than node 368), there is a reduction in the magnitude of the drain-source current of transistor 384, while the magnitude of the gate-source voltage on transistor 388 increases causing more drain-source current to flow through transistor 388. Consequently, the drain-source current through transistor 386 increases through the action of the current mirror arrangement formed by transistors 392 and 368. Therefore, sinking transistor 386 sinks more current from load 364 to decrease the voltage on node 360 until it matches $V_{IN}$.

Through the combination of the feedback network and sourcing and sinking transistors 384 and 386, respectively, the voltage at node 360 follows the applied analog input signal $V_{IN}$ at the inverting terminal of amplifier 310. During negative swings of $V_{IN}$, the feedback network causes sinking transistor 386 to sink more current to decrease the voltage at node 360 until it equals $V_{IN}$. During positive swings of $V_{IN}$, the feedback network causes sourcing transistor 384 to source more current to increase the voltage at node 360 until it equals $V_{IN}$. Because no nominal voltage drop exists between the inverting and noninverting inputs of amplifier 310, no nominal voltage drop exists between the input of output stage 300 and the output of output stage 300. Consequently, the output of output stage 300 swings rail-to-rail with minimum distortion.

Figure 8:
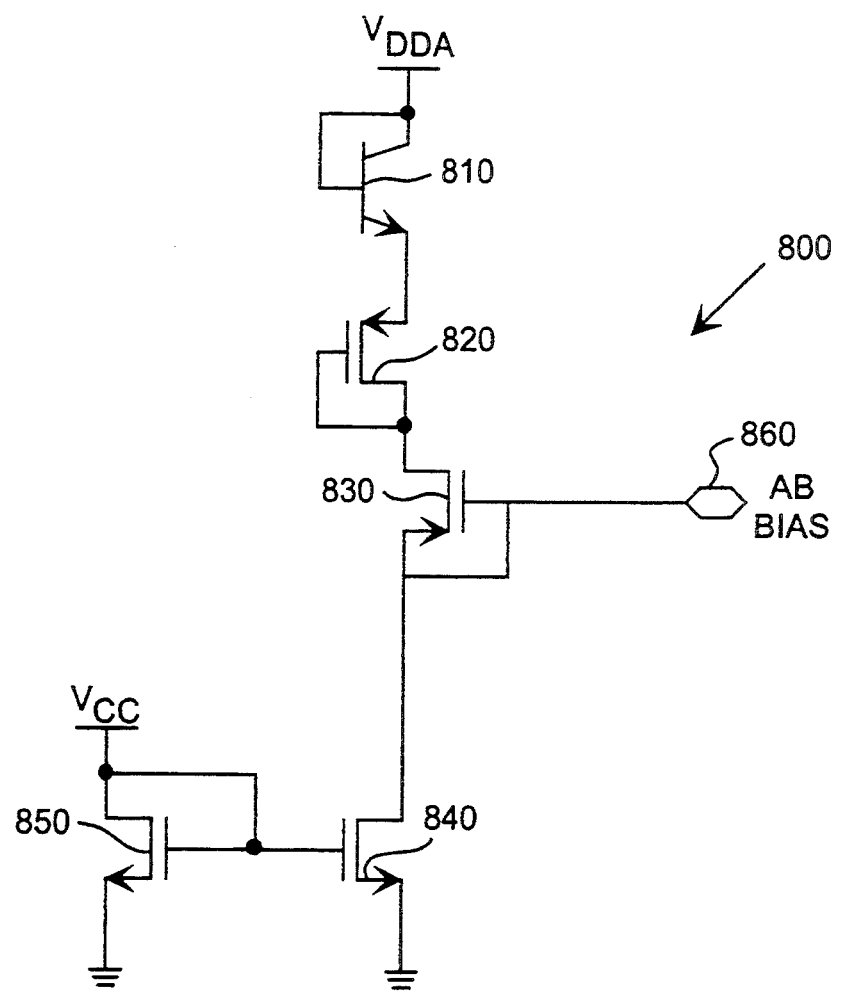
FIG. 8 is a schematic diagram of a DC biasing circuit which may be used with the output stage of FIG. 2.
Figure 9:
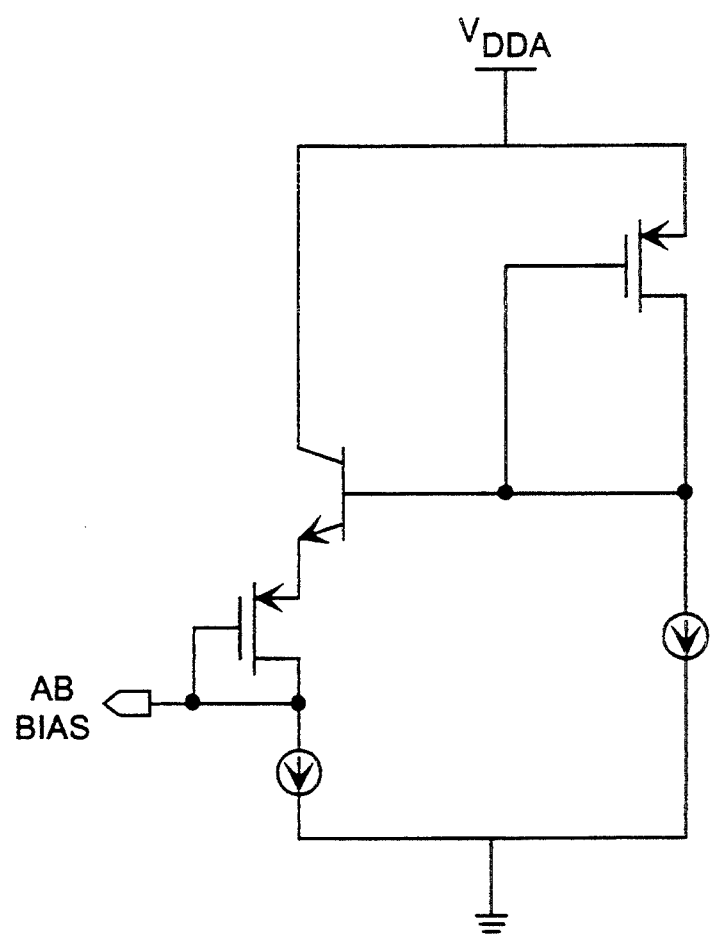
FIG. 9 is a schematic diagram of a DC biasing circuit which may be used with the output stage of FIG. 2.

The quiescent current (i.e. DC current drawn without a dynamic activating signal applied to the input) is set by a bias voltage which is applied to the gate of transistor 388 to maintain transistors 386, 392, 384, and 388 in saturation. FIG. 9 illustrates a bias circuit which is suitable for generating the appropriate bias, voltage, the operation of which is disclosed in U.S. Pat. No. 5,198,782, entitled "Low Distortion Amplifier Output Stage for DAC", issued Mar. 30, 1993 to Jeffrey W. Scott. Additionally. FIG. 8 illustrates another bias circuit which is suitable for generating the appropriate bias voltage.

Referring to FIG. 8, bias circuit 800 comprises NPN bi-polar junction transistor 810, P-channel transistors 820 and. 830 and N-channel sinking transistors 840 and 850. Because the gate-to-source voltages of transistors 840 and 850 are always equal, the current through transistors 840 and 850 is always equal and constant. The junction width and length (i.e., size) of transistor 810 matches the size of transistor 390, while the channel width and length (i.e., size) of transistor 820 matches the size of transistor 384. Furthermore, the size of transistor 830 matches the size of transistor 388. By matching the size of these transistors, transistors 810, 820, and 830 have the same base-to-emitter or gate-to-source voltage ($V_{GS}$) as transistors 390, 384, and 388, respectively. Therefore, the voltage applied from AB bias terminal 860 to the gate of transistor 388 equals $V_{DDA}$ minus the base-to-emitter voltage drop of transistor 390 and the voltage drop of transistors 384 and, 388. Accordingly, because the previously described transistors in bias circuit 800 match the transistors in output stage 300, the quiescent current in output stage 300 matches the bias current in bias circuit 800. Consequently, the quiescent current in output stage 300 remains constant over varying temperature and power supply.

The present invention overcomes the limitations in the related art and is particularly effective when configured and employed as described herein. However, those skilled in the art will readily recognize that numerous variations and substitutions may be made to the invention to achieve substantially the same results as achieved by the preferred embodiment.

Figure 4:
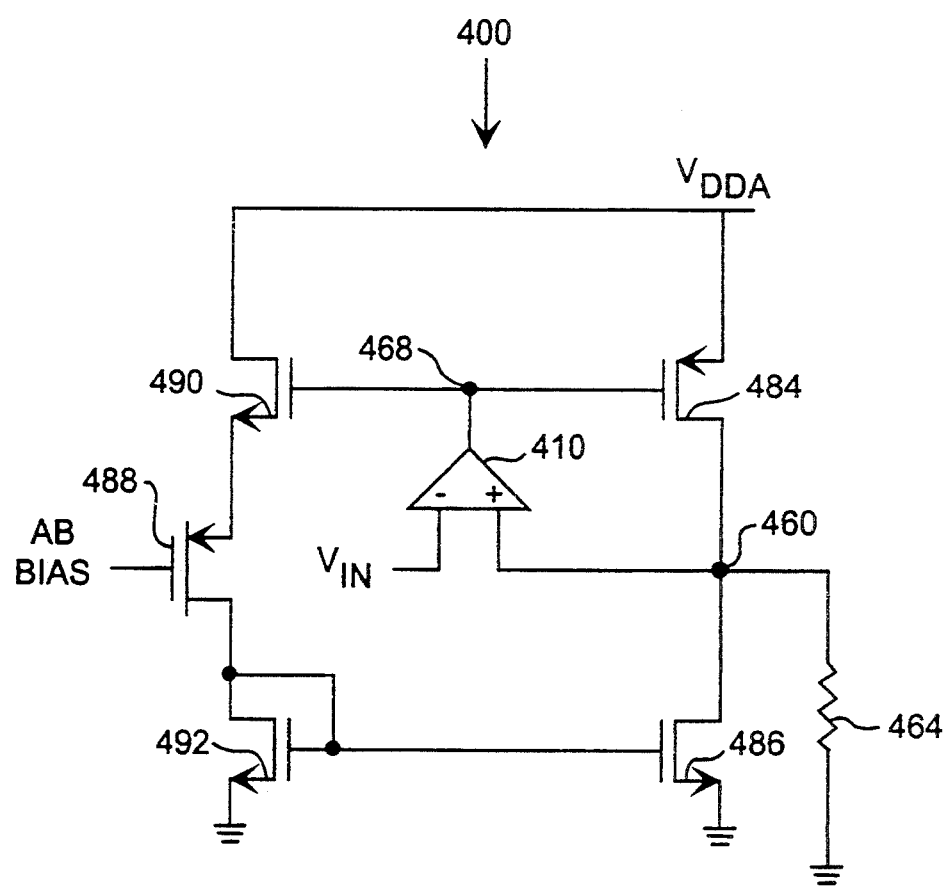
FIG. 4 is a schematic diagram of a second embodiment of the output stage of the present invention.
Figure 6:
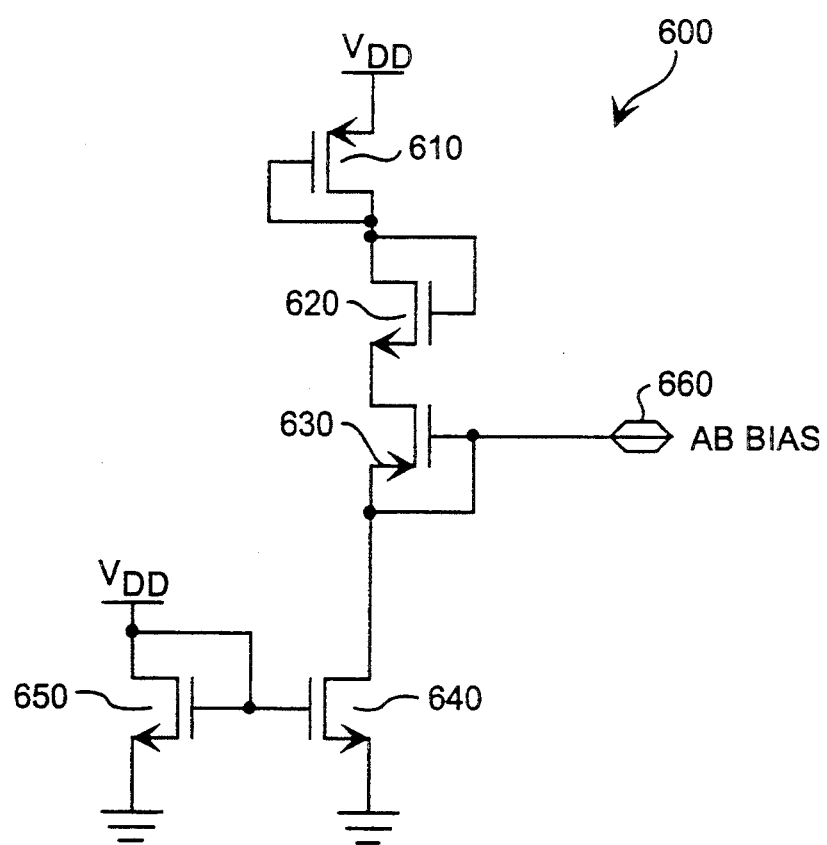
FIG. 6 is a schematic diagram of a DC biasing circuit which may be used with the output stage of FIG. 4.

For example, FIG. 4 illustrates a second embodiment of output stage 300. Referring to FIGS. 2 and 4, output stage 400 replaces the current-controlled, NPN bi-polar junction transistor 390 with a voltage-controlled, N-channel transistor 490. As $V_{IN}$ swings positive and negative with respect to the voltage on node 460, inverting amplifier 410 swings the voltage at node 468 comparably negative and positive, respectively. Consequently, as the voltage on node 468 swings positive and negative, the magnitude of the gate-source voltage across transistor 488 increases and decreases, respectively, to control the amount of current flow through the feedback network (i.e., transistors 490, 488, and 492) and sinking transistor 486. In all other respects, output stage 400 functions identically to output stage 300. The quiescent current for output stage 400 is set by the bias voltage on the gate of transistor 488. FIG. 6 illustrates one suitable bias circuit for generating the appropriate bias voltage.

Referring to FIG. 6, bias circuit 600 comprises P-channel transistors 610 and 630 and N-channel transistors 620, 640, and 650. Because the gate-to-source voltages of transistors 640 and 650 are always equal, the current through transistors 640 and 650 is always equal and constant. The channel width and length (i.e. size) of transistor 610 matches the size of transistor 484, while the size of transistor 620 matches the size of transistor 490. Furthermore, the size of transistor 630 matches the size of transistor 488. Consequently, by matching the size of these transistors, transistors 610, 620, and 630 have the same gate-to-source voltage ($V_{GS}$) as transistors 484, 490, and 488, respectively. Therefore, the voltage applied from AB bias terminal 660 to the gate of transistor 488 equals $V_{DDA}$ minus the $V_{GS}$ of transistors 484, 490, and 488. Accordingly, because the previously described transistors in bias circuit 600 match the transistors in output stage 400, the quiescent current in output stage 400 matches the bias current in bias circuit 600. Consequently, the quiescent current in output stage 400 remains constant over varying temperature and power supply.

Figure 5:
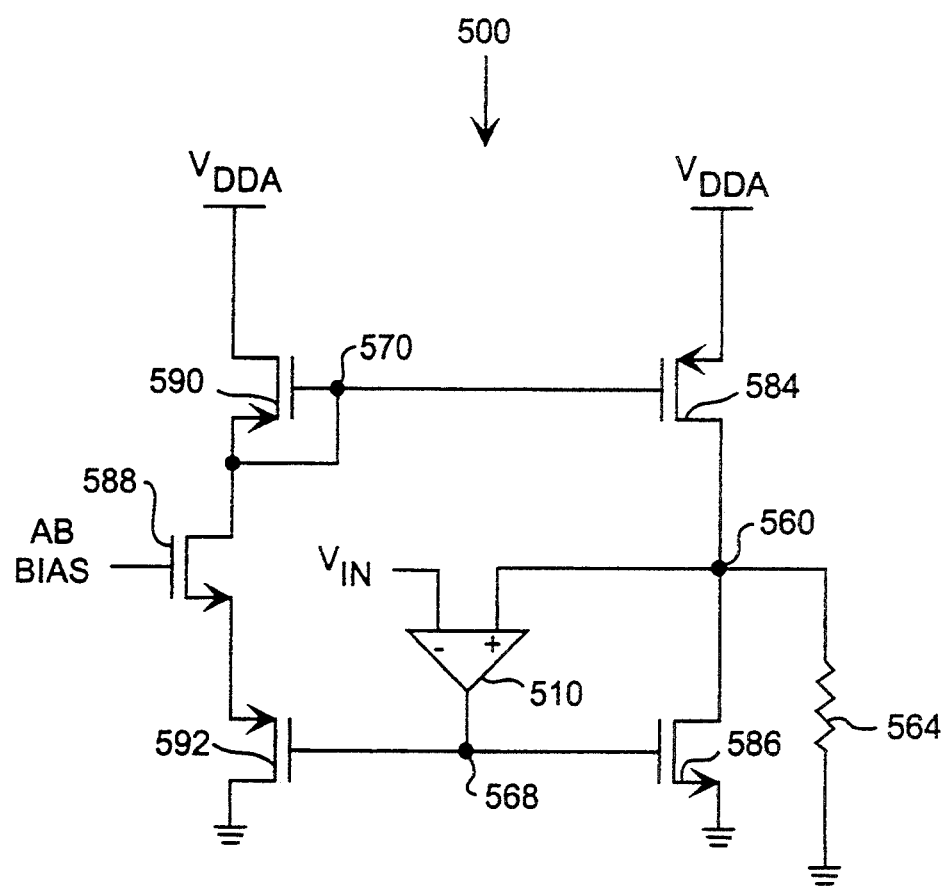
FIG. 5 is a schematic diagram of a third embodiment of the output stage of the present invention.

Moreover, FIG. 5 illustrates a third embodiment of output stage 300. Output stage 500 comprises: 1) an inverting differential amplifier 510; 2) P-channel sourcing transistor 584 and N-channel sinking transistor 586; and 3) a feedback network comprising P-channel transistor 592, N-channel transistor 588, and a P-channel transistor 590. Transistors 590 and 584 are configured as current mirrors. DC power is supplied by power supply $V_{DDA}$ and a reference potential $V_{SSA}$ (e.g. ground).

Amplifier 510 includes an inverting input for receiving an analog input signal $V_{IN}$, such as an audio signal, a noninverting input connected to the output of output stage 500 (i.e., node 560), and an output connected to node 568. Any suitable differential amplifier may implement amplifier 510, however, in this preferred embodiment, amplifier 510 should have a common mode range which allows it to swing nearly rail-to-rail. That is, amplifier 510 should be capable of swinging nearly rail-to-rail when a common signal is applied to both its inverting and noninverting input. FIG. 3 illustrates an amplifier suitable to implement amplifier 310, the operation of which is disclosed in *IEEE Journal of Solid-State Circuits*, Vol. 1 SC-22, No. 6, December 1957, pp. 1204-1207.

Again referring to FIG. 5, the feedback network (i.e., transistors 590, 588, and 592) and sourcing and sinking transistors 584 and 586, respectively, cause the voltage at node 560 to follow the analog input signal $V_{IN}$ applied at the inverting terminal of amplifier 510. Specifically, as $V_{IN}$ swings positive with respect to the voltage on node 560, inverting amplifier 510 swings the voltage on node 568 comparably negative (e.g. the voltage on node 568 is within a first range which is more negative than node 560). Consequently, the drain-source current through transistor 586 is reduced, while the gate-source voltage across transistor 588 increases, which increases the current through transistors 590, 588, and 592. Consequently, sourcing transistor 584 sources more current to drive load 564 and increases the voltage on node 560 until it matches $V_{IN}$.

Conversely, as $V_{IN}$ swings negative with respect to the voltage on node 560, inverting amplifier 510 swings the voltage on node 568 comparably positive (e.g., the voltage on node 568 is within a second range which is more positive than node 560). Consequently, the current through transistor 586 increases, while the gate-source voltage of transistor 588 decreases, which reduces the current through transistors 590, 588, and 592. As a result, the voltage on node 570 increases to reduce the current through sourcing transistor 584. Consequently, sinking transistor 586 sinks more current from load 564 to decrease the voltage on node 560 until it matches $V_{IN}$.

Through the combination of the feedback network and sourcing and sinking transistors 584 and 586, respectively, the voltage at node 560 follows the applied analog input signal $V_{IN}$ at the inverting terminal of amplifier 510. During negative swings of $V_{IN}$, the feedback network causes sinking transistor 586 to sink more current to decrease the voltage at node 560 until it equals $V_{IN}$. During positive swings of $V_{IN}$, the feedback network causes sourcing transistor 584 to source more current to increase the voltage at node 560 until it equals $V_{IN}$. Because no nominal voltage drop exists between the inverting and noninverting inputs of amplifier 510, no nominal voltage drop exists between the input of output stage 500 and the output of output stage 500. Consequently, the output of output stage 500 swings nearly rail-to-rail with minimum distortion.

Figure 7:
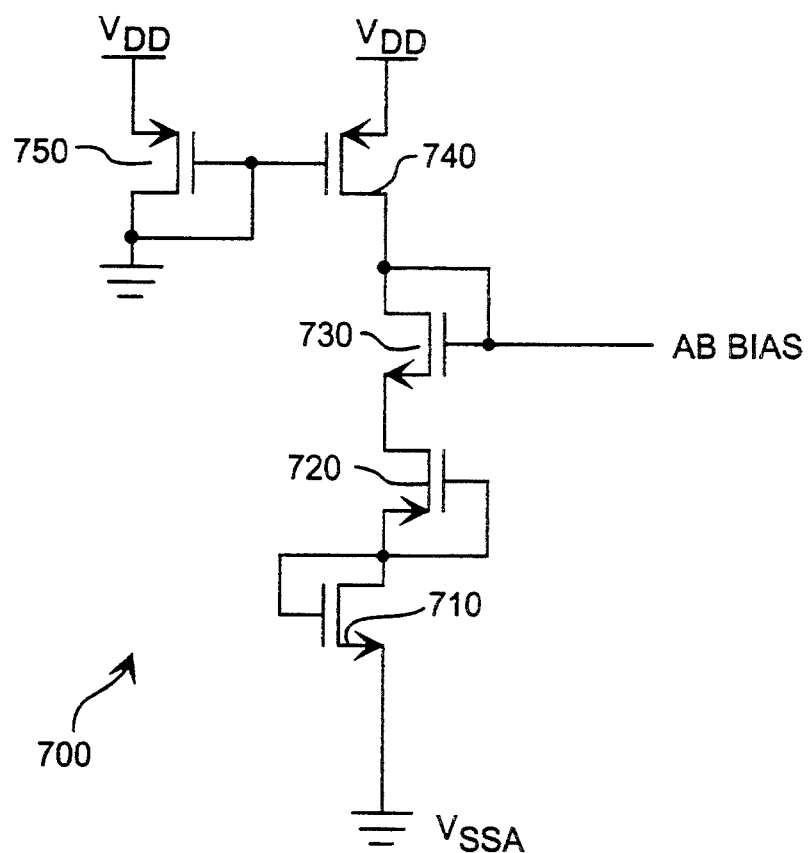
FIG. 7 is a schematic diagram of a DC biasing circuit which may be used with the output stage of FIG. 5.

The quiescent current for output stage 500 is set by the bias voltage on the gate of transistor 588. FIG. 7 illustrates a suitable bias circuit for generating the appropriate bias voltage. Referring to FIGS. 5 and 7, bias circuit 700 comprises N-channel transistors 710 and 730 and P-channel transistors 720, 740, and 750. Because the gate-to-source voltages of transistors 740 and 750 are always equal, the sourcing current through transistors 740 and 750 is always equal and constant. The channel width and length (i.e. size) of transistor 710 matches the size of transistor 586, while the size of transistor 720 matches the size of transistor 592. Furthermore, the size of transistor 730 matches the size of transistor 588. Consequently, by matching the size of these transistors, transistors 710,720, and 730 have the same gate-to-source voltage ($V_{GS}$) as transistors 584, 590, and 588, respectively. Therefore, the voltage applied from AB bias terminal 660 to the gate of transistor 488 equals $V_{SSA}$ plus the $V_{GS}$ of transistors 584, 590, and 588. Accordingly, because the previously described transistors in bias circuit 700 match the transistors in output stage 500, the quiescent current in output stage 500 matches the bias current in bias circuit 700. Consequently, the quiescent current in output stage 500 remains constant over varying temperature and power supply.

Although the present invention has been described in terms of the foregoing preferred embodiments, this description has been provided by way of explanation only and is not necessarily to be construed as a limitation of the invention. Illustratively, while the preferred embodiments are implemented in a P-well process, numerous CMOS processes, including twin tub and N-well, are suitable as well. Furthermore, while CMOS technology is used to advantage in the embodiment shown, any semiconductor circuitry which exhibits similar or even more advantageous characteristics could be substituted. For example, improved logic structures and innovative integrated circuit technology such as silicon-on-insulator structures could be substituted to improve circuit operation speed and reduce power consumption. Accordingly, various other embodiments and modifications and improvements not described herein may be within the spirit and scope of the invention, as defined by the following claims.

I claim:

1. A low distortion output stage for an operational amplifier for driving a resistive load, comprising:
    an amplifier having a first input for receiving an input voltage, a second input connected to one side of the load, and an output;
    a current source for sourcing current to the load when the voltage on said output of said amplifier is within a first range comprising a transistor having a control terminal connected to said amplifier output, a first terminal connected to a DC power supply, and a second terminal connected to one side of the load;
    a current sink for sinking current from the load when the voltage on said output of said amplifier is within a second range, comprising a transistor having a control terminal connected to a feedback network, a first terminal connected to one side of the load, and a second terminal connected to a reference potential; and
    wherein said feedback network for controlling said current source and said current sink to source or sink current, respectively, to the load comprises a first transistor having a control terminal connected to said output of said amplifier for sensing the voltage on said output of said amplifier to control the current and said current sink, a first terminal connected to a DC power supply, and a second terminal; a second transistor having a control terminal for receiving a biasing voltage, a first terminal connected to said second terminal of said first transistor and a second terminal; and a third transistor having a control terminal connected to said control terminal of said transistor of said current sink, a first terminal connected to both said second terminal of said second transistor and said control terminal of said third transistor, and a second terminal connected to the reference potential.

2. The low distortion output stage according to claim 1 further comprising a biasing circuit for generating said biasing voltage, comprising:
    a first transistor having a first terminal connected to said DC power supply, a second terminal, and a control terminal connected to said second terminal, wherein said first transistor matches the size of said transistor of said current source;
    a second transistor having a first terminal connected to said second terminal of said first transistor, a second terminal, and a control terminal connected to said first terminal of said second transistor, wherein said second transistor matches the size of said first transistor of said feedback network;
    a third transistor having a control terminal for delivering said bias voltage to said control terminal of said second transistor of said feedback network, a first terminal connected to said second terminal of said second transistor, and a second terminal connected to said control terminal of said third transistor, wherein said third transistor matches the size of said second transistor of said feedback network; and
    a current sink connected to said second terminal of said third transistor.

3. The low distortion output stage according to claim 1 further comprising a biasing circuit for generating said biasing voltage, comprising:
    a first transistor having a first terminal connected to said DC power supply, a second terminal, and a control terminal connected to said first terminal, wherein said first transistor matches the size of said first transistor of said feedback network;
    a second transistor having a first terminal connected to said second terminal of said first transistor, a second terminal, and a control terminal connected to said second terminal, wherein said second transistor matches the size of said transistor of said current source; and
    a third transistor having a control terminal for delivering the bias voltage to said control terminal of said second transistor of said feedback network, a first terminal connected to said second terminal of said second transistor, and a second terminal connected to said control terminal of said third transistor, wherein said third transistor matches the size of said second transistor of said feedback network; and
    a current sink connected to said second terminal of said third transistor.

4. A low distortion output stage for an operational amplifier for driving a resistive loads comprising:
    an amplifier having a first input for receiving an input voltages a second input connected to one side of the load, and an output;
    a current source for sourcing current to the load when the voltage on said output of said amplifier is within a first ranges comprising a transistor having a control terminal connected to a feedback networks a first terminal connected to one side of the load, and a second terminal connected to a DC power supply;
    a current sink for sinking current from the load when the voltage on said output of said amplifier is within a second ranged comprising a transistor having a control terminal connected to said output of said amplifier, a first terminal connected to a reference voltages and a second terminal connected to one side of the load; and wherein said feedback network for controlling said current source and said current sink to source or sink current, respectively, to the load comprises a first transistor having a control terminal connected to said output of said amplifier for sensing the voltage on said output of said amplifier to control the current in said current source, a first terminal connected to said reference voltage, and a second terminal; a second transistor having a control terminal for receiving a biasing voltage, a first terminal connected to said second terminal of said first transistor and a second terminal; and a third transistor having a control terminal connected to said control terminal of said transistor of said current source, a first terminal connected to both said second terminal of said second transistor and said control terminal of said third transistor, and a second terminal connected to said DC power supply.

5. The low distortion output stage according to claim 4 further comprising a biasing circuit for generating a biasing voltage, comprising:

a first transistor having a first terminal connected to the reference potential, a second terminal, and a control terminal connected to said second terminal, wherein said first transistor matches the size of said transistor of said current sink;

a second transistor having a first terminal connected to said second terminal of said first transistor, a second terminal, and a control terminal connected to said first terminal of said second transistor, wherein said second transistor of said biasing circuit matches the size of said first transistor of said feedback network;

a third transistor having a control terminal for delivering the bias voltage to said control terminal of said second transistor of said feedback network, a first terminal connected to said second terminal of said second transistor, and a second terminal connected to said control terminal of said third transistor, wherein said third transistor matches the size of said second transistor of said feedback network; and a current source connected to said second terminal of said third transistor.

* * * * *